(12) United States Patent
van der Straten et al.

(10) Patent No.: US 12,745,570 B2
(45) Date of Patent: Sep. 22, 2026

(54) MRAM DEVICE WITH HEXAGONAL SHAPED ELECTRODES

(71) Applicant: INTERNATIONAL BUSINESS MACHINES CORPORATION, Armonk, NY (US)

(72) Inventors: Oscar van der Straten, Guilderland Center, NY (US); Gabriel Rodriguez, Albany, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 544 days.

(21) Appl. No.: 18/317,989

(22) Filed: May 16, 2023

(65) Prior Publication Data

US 2024/0389469 A1 Nov. 21, 2024

(51) Int. Cl.

| | |
|---|---|
| ***H10N 50/80*** | (2023.01) |
| ***H10B 61/00*** | (2023.01) |
| ***H10N 50/01*** | (2023.01) |
| ***H10N 50/20*** | (2023.01) |

(52) U.S. Cl.
CPC ............. *H10N 50/80* (2023.02); *H10B 61/00* (2023.02); *H10N 50/01* (2023.02); *H10N 50/20* (2023.02)

(58) Field of Classification Search
CPC ........ H10N 50/80; H10N 50/20; H10N 50/10; H10B 61/00
See application file for complete search history.

(56) References Cited

U.S. PATENT DOCUMENTS

| | | | | |
|---|---|---|---|---|
| 8,339,841 B2 | 12/2012 | Masayoshi | | |
| 8,455,965 B2 | 6/2013 | Li | | |
| 8,644,063 B2 | 2/2014 | Li | | |
| 11,114,606 B2 | 9/2021 | Reznicek | | |
| 2010/0054028 A1* | 3/2010 | Xia | H10N 50/10 | 365/158 |
| 2010/0200900 A1* | 8/2010 | Iwayama | H10N 50/01 | 257/295 |
| 2015/0056722 A1 | 2/2015 | Li | | |
| 2016/0284761 A1* | 9/2016 | Zhou | H10N 50/85 | |
| 2017/0294576 A1* | 10/2017 | Huang | H10N 50/01 | |
| 2021/0151664 A1 | 5/2021 | Wu | | |
| 2022/0416158 A1 | 12/2022 | Loy | | |

OTHER PUBLICATIONS

Pending U.S. Appl. No. 18/048,455, filed Oct. 21, 2022, entitled: "MRAM Device With Octagon Profile", 37 pages.
Pending U.S. Appl. No. 18/317,951, filed May 16, 2023, entitled: "MRAM Device With Trapezoid Shaped Electrodes", 29 pages.

* cited by examiner

*Primary Examiner* — Shih Tsun A Chou
(74) *Attorney, Agent, or Firm* — Samuel A. Waldbaum

(57) ABSTRACT

A semiconductor device including a magnetic tunnel junction (MTJ) stack, where a cross section of a bottom electrode of the stack includes a hexagonal profile. A semiconductor device including a lower word line, a magnetic tunnel junction (MTJ) stack, where a cross section of a first electrode of the MTJ stack comprises a hexagonal profile. A method including forming a bottom electrode, the bottom electrode includes a side surface including a width at a middle section of the bottom electrode greater than a width at a lower surface of the bottom electrode, and the width at the middle section of the bottom electrode greater than a width at an upper surface of the bottom electrode.

11 Claims, 14 Drawing Sheets

MRAM DEVICE WITH HEXAGONAL SHAPED ELECTRODES

BACKGROUND

The present invention relates, generally, to the field of semiconductor manufacturing, and more particularly to fabricating a magnetic tunnel junction device with hexagonal shaped electrodes.

Magneto resistive random-access memory ("MRAM") devices are used as non-volatile computer memory. MRAM data is stored by magnetic storage elements. The elements are formed from two ferromagnetic layers, each of which can hold a magnetic field, separated by a spin conductor layer. One of the two layers is a reference magnet, or a reference layer, set to a particular polarity, while the remaining layer's field can be changed to match that of an external field to store memory and is termed the "free magnet" or "free-layer". This configuration is known as the magnetic tunnel junction (MTJ) and is the simplest structure for a MRAM bit of memory.

SUMMARY

According to an embodiment of the present invention, a semiconductor device is provided. The semiconductor device including a magnetic tunnel junction (MTJ) stack, where a cross section of a bottom electrode of the stack includes a hexagonal profile.

According to an embodiment of the present invention, a semiconductor device is provided. The semiconductor device including a lower word line, a magnetic tunnel junction (MTJ) stack, where a cross section of a first electrode of the MTJ stack comprises a hexagonal profile.

According to an embodiment of the present invention, a method is provided. The method including forming a bottom electrode, the bottom electrode includes a side surface including a width at a middle section of the bottom electrode greater than a width at a lower surface of the bottom electrode, and the width at the middle section of the bottom electrode greater than a width at an upper surface of the bottom electrode.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
FIG. 1 illustrates a cross-sectional view of a multi-state memory cell, according to an exemplary embodiment.
Figure 1:
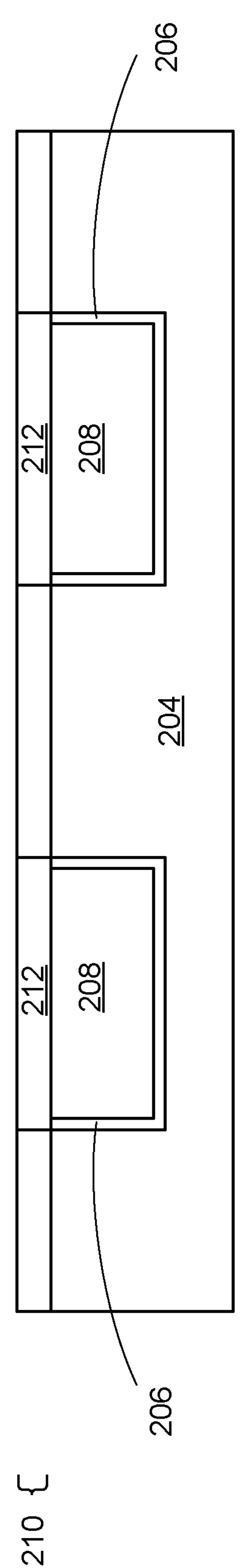

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As stated above, magneto resistive random-access memory (hereinafter "MRAM") devices are a non-volatile computer memory technology. MRAM data is stored by magnetic storage elements. The elements are formed from two ferromagnetic layers, each of which can hold a magnetic field, separated by a spin conductor layer. One of the two layers is a reference magnet, or a reference layer, set to a particular polarity, while the remaining layer's field can be changed to match that of an external field to store memory and is termed the "free magnet" or "free-layer". The magnetic reference layer may be referred to as a reference layer, and the remaining layer may be referred to as a free layer. This configuration is known as the magnetic tunnel junction (hereinafter "MTJ") and is the simplest structure for a MRAM bit of memory.

A memory device is built from a grid of such memory cells or bits. In some configurations of MRAM, such as the type further discussed herein, the magnetization of the magnetic reference layer is fixed in one direction (up or down), and the direction of the magnetic free layer can be switched by external forces, such as an external magnetic field or a spin-transfer torque generating charge current. A smaller current (of either polarity) can be used to read resistance of the device, which depends on relative orientations of the magnetizations of the magnetic free layer and the magnetic reference layer. The resistance is typically higher which the magnetizations are anti-parallel and lower when they are parallel, though this can be reversed, depending on materials used in fabrication of the MRAM.

The MRAM stack layers may be conformally formed using known techniques. In formation of the MTJ stacks layers, the reference layer is formed on a dielectric and a bottom electrode. The tunneling barrier layer is formed on the reference layer. In an embodiment, the tunneling barrier layer is a barrier, such as a thin insulating layer or electric potential, between two electrically conducting materials. Electrons (or quasiparticles) pass through the tunneling barrier layer by the process of quantum tunneling. In certain embodiments, the tunneling barrier layer includes at least one sublayer composed of magnesium oxide (MgO). It should be appreciated that materials other than MgO can be used to form the tunneling barrier layer. The free layer is a magnetic free layer that is adjacent to tunneling barrier layer and opposite the reference layer. The free layer has a magnetic moment or magnetization that can be flipped. It should also be appreciated that the MTJ stack layers may include additional layers, omit certain layers, and each of the layers may include any number of sublayers. Moreover, the composition of layers and/or sublayers may be different between the different MRAM stacks.

For high performance MRAM devices based on perpendicular magnetic tunnel junction (MTJ) structures, well-defined interfaces and interface control are essential. MTJ structures typically include a cobalt (Co) based synthetic anti-ferromagnet (SAF), a CoFeB-based reference layer, a MgO-based tunnel barrier, a CoFeB-based free layer, and cap layers containing e.g. tantalum (Ta) and/or ruthenium (Ru). Embedded MTJ structures are usually formed by subtractive patterning of blanket MTJ stacks into pillars between two metal levels.

A problem when forming an embedded MTJ structures is an MRAM tunnel barrier short. Reactive ion etch (RIE) and ion beam etch (IBE) processing of such MTJ stacks presents a major challenge as it typically leads to shorts due to re-sputtering of thick bottom metal layers on MTJ stack sidewalls. There is a need for an embedded MTJ structure formed by methods with a reduced risk of shorts due to metal re-sputtering.

A problem when forming an inter-layer dielectric (ILD) surrounding multiple layers of MTJ structures is an MRAM short due to gap fill issues. After MTJ stack patterning, the inter-pillar spaces are filled with an ILD to enable connection to back end of line (BEOL) wiring by a top contact level. ILD gap fill between pillars presents a significant challenge since the presence of voids in the ILD between the pillars can lead to shorts. The shorts are formed when a gap in the ILD is filled with a conductive material when a subsequent top contact is formed, leaded to a short between adjacent top contacts of adjacent MTJ pillars. There is a need for an embedded MTJ structure formed by methods with a reduced risk of shorts due to gap fill issues.

In this invention, hexagonal shaped bottom electrodes and top electrodes help prevent shorts due to metal re-sputtering and help prevent shorts due to gap fill issues. The hexagonal shaped electrodes extend scalability of MRAM/memory elements due to a void-free ILD gap fill between MRAM pillars and improvement of embedded MRAM performance due to reduced top contact shorts.

In an embodiment, the bottom electrode and the top electrode have a hexagonal shape, with a lower horizontal surface and an upper horizontal surface less wide than a width of a middle section of each of the top and bottom electrodes. The hexagonal shape helps to prevent metal re-sputtering. Inter-pillar spaces are filled with multiple ILD layers. A first ILD surrounds the bottom electrode. A second ILD surrounds an encapsulation layer which surrounds the reference layer, the tunneling barrier and the free layer. A third ILD surrounds the top electrode. Each of these ILD layers has a low aspect ratio reducing a gap fill concern.

The present invention relates to fabricating a MTJ device with hexagonal shaped electrodes.

Referring now to FIG. 1, a semiconductor structure 200 (hereinafter "structure") at an intermediate stage of fabrication is shown according to an exemplary embodiment. FIG. 1 is a cross-sectional view of the structure 200. The structure 200 may be formed or provided. The structure 200 may include a cell 201 and a cell 203. The cells 201, 203, each includes, for example, an inter-layer dielectric (hereinafter "ILD") 204, a liner 206, a lower metal wire 208, a dielectric cap 210, and a metal cap 212.

The structure 200 may include several back end of line ("BEOL") layers. In general, the back end of line (BEOL) is the second portion of integrated circuit fabrication where the individual devices (transistors, capacitors, resistors, etc.) are interconnected with wiring on the wafer.

The ILD 204 may be formed by depositing or growing a dielectric material on the BEOL layers, followed by a chemical mechanical polishing (CMP) or etch steps. The ILD 204 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by a planarization process, such as CMP, or any suitable etch process. In an embodiment, the ILD 104 may include one or more layers. In an embodiment, the ILD 204 may include any dielectric material such as silicon oxide (SiOx), silicon nitride (SiNx), silicon boron carbonitride (SiBCN), a low-k dielectric material (with k<4.0), including but not limited to, silicon oxide, spin-on-glass, a flowable oxide, a high-density plasma oxide, borophosphosilicate glass (BPSG), or any combination thereof or any other suitable dielectric material.

The lower metal wire 208 may be formed by first patterning a trench (not shown) into the ILD 204, lining the trench with the liner 206, and filling the trench.

The liner 206 separates the conductive interconnect material of the lower metal wire 208 from the ILD 204. The liner 206 may be composed of, for example, tantalum nitride (TaN), tantalum (Ta), titanium (Ti), titanium nitride (TiN), or a combination thereof. The liner 106 may be deposited utilizing a conventional deposition process such as, for example, CVD, plasma enhanced chemical vapor deposition (PECVD), PVD or ALD. The liner 206 may be 5 nm thick, although a thickness less than or greater than 5 nm may be acceptable. The liner 206 surrounds a lower horizontal surface and a vertical side surface of the lower metal wire 208.

In an embodiment, the lower metal wire 208 is formed from a conductive material layer which is blanket deposited on top of the structure 200, and directly on a top surface of the liner 206, filling the trench (not shown). The conductive material layer may include materials such as, for example copper (Cu), ruthenium (Ru), cobalt (Co), tungsten (W). The conductive material can be formed by for example, chemical vapor deposition (CVD), physical vapor deposition (PVD), and atomic layer deposition (ALD) or a combination thereof. The lower metal wire 108 is formed by damascene, or patterned from the conductive material layer, using known patterning and etching techniques. There may be any number of openings in the ILD 204, each filled with the liner 206 and the lower metal wire 208, on the structure 200.

A planarization process, such as, for example, chemical mechanical polishing (CMP), may be done to remove excess material from a top surface of the structure 200 such that upper horizontal surfaces of the lower metal wire 208, the liner 206 and the ILD 204 are coplanar.

In an embodiment, the lower metal wire 208 may have a thickness ranging from about 10 nm to about 100 nm, although a thickness less than 10 nm and greater than 100 nm may be acceptable.

The dielectric cap 210 may be formed as described for the ILD 204, directly on a top surface of the liner 206, the lower metal wire 208 and the ILD 204. The metal cap 212 may be formed by first patterning a second trench (not shown) into the dielectric cap 210 vertically aligned above the lower metal wire 208 and the liner 206, and filling the second trench. The dielectric cap 210 is unlikely to contain voids as the dielectric cap 210 is blanket deposited on the planarized upper surface of the lower metal wire 208 and the liner 206.

In an embodiment, the metal cap 212 is formed from a conductive material layer which is blanket deposited on top of the structure 200, and directly on a top surface of the dielectric cap 210, the liner 206, the lower metal wire 208 and the ILD 204. The conductive material layer may include materials such as, for example tantalum (Ta), ruthenium (Ru), titanium (Ti), tungsten (W). The conductive material can be formed by for example, chemical vapor deposition (CVD), physical vapor deposition (PVD), and atomic layer deposition (ALD) or a combination thereof. The metal cap 212 is formed by damascene, or patterned from the conductive material layer, using known patterning and etching techniques. Damascene is the method of BEOL interconnect formation. A dielectric is deposited, patterned, and the resulting feature is metallized. Any metal overburden is removed by planarization.

A planarization process, such as, for example, chemical mechanical polishing (CMP), may be done to remove excess material from a top surface of the structure 200 such that upper horizontal surfaces of the metal cap 212 and the dielectric cap 210 are coplanar.

Figure 2:
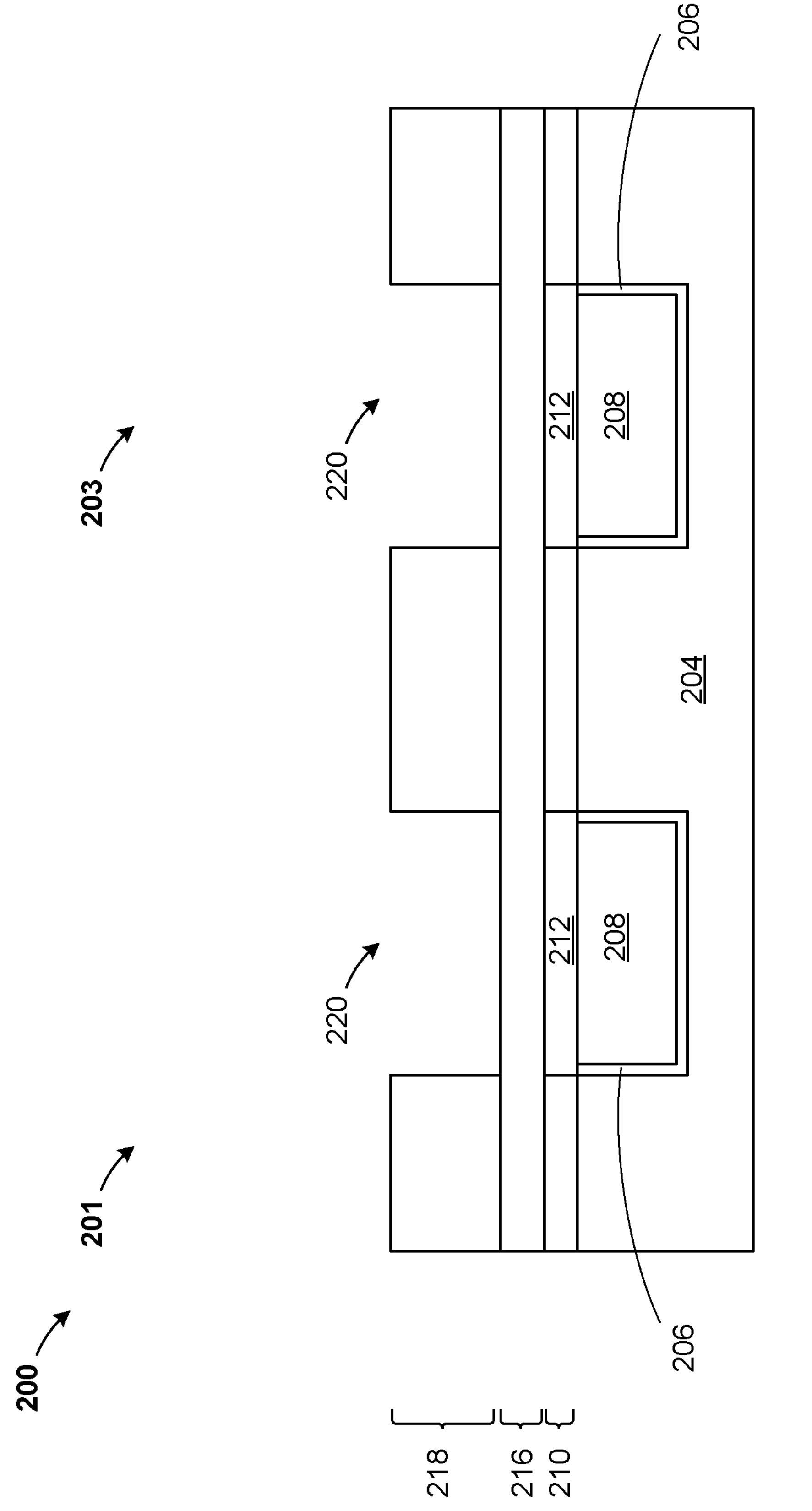
FIG. 2 illustrates a cross-sectional view of the multi-state memory cell and illustrates formation of an inter-layer dielectric and a hard mask, according to an embodiment.

Referring now to FIG. 2, a cross-sectional view of the structure 200 is shown, according to an embodiment. An inter-layer dielectric (hereinafter "ILD") 216 and a hard mask 218 may be formed.

The ILD 216 may be formed as described for the ILD 204, directly on an upper horizontal surface of the metal cap 212 and the ILD 204.

The hard mask 218 may be patterned such that an opening 220 in the hard mask 218 is vertical aligned above the metal cap 212 and the lower metal wire 208, in each of the cells 101, 103.

Figure 3:
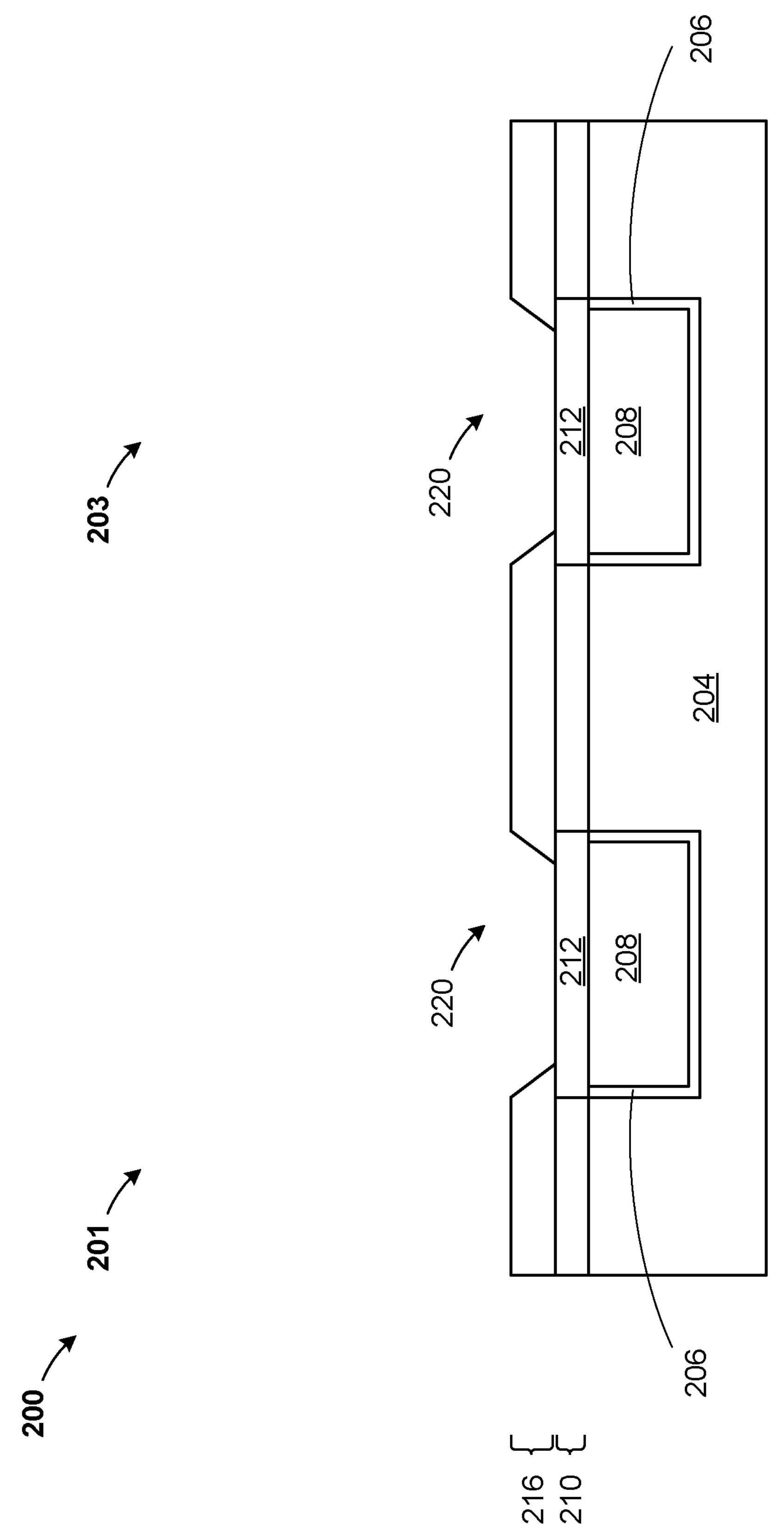
FIG. 3 illustrates a cross-sectional view of the multi-state memory cell and illustrates patterning of the inter-layer dielectric, according to an embodiment.

Referring now to FIG. 3, a cross-sectional view of the structure 200 is shown, according to an embodiment. Portions of the ILD 216 may be removed. The hard mask 218 may be removed.

Portions of the ILD 216 may be removed selective to the hard mask 218, exposing an upper horizontal surface of the metal cap 212 and extending the opening 220 into the ILD 216. The portions of the ILD 216 may be selectively removed using an anisotropic etching technique, such as, for example, reactive ion etching. Remaining portions of the ILD 216 may remain between the cells 201, 203. The opening 220 may have a vertical side surface which is angled, such that a width of the opening 220 is widest at a higher level furthest from the metal wire 208.

Figure 4:
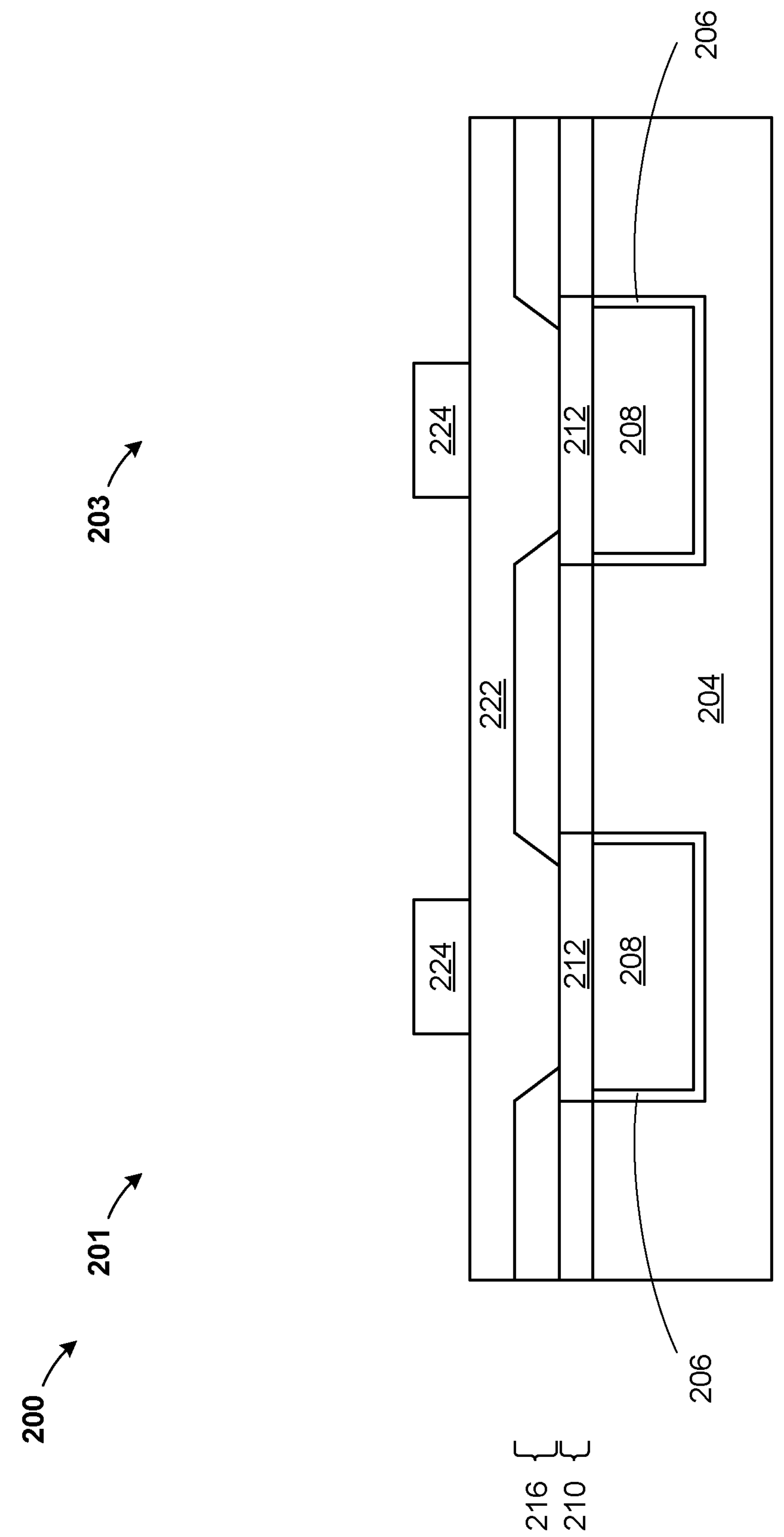
FIG. 4 illustrates a cross-sectional view of the multi-state memory cell and illustrates formation of a bottom electrode layer and a hard mask, according to an exemplary embodiment.

Referring now to FIG. 4, a cross-sectional view of the structure 200 is shown, according to an embodiment. A bottom electrode 222 may be formed and a hard mask 224 may be formed.

In an embodiment, the bottom electrode 222 is formed from a conductive material layer which is blanket deposited on top of the structure 200, and directly on a top surface of the metal cap 212 and the ILD 216. The conductive material layer may include materials such as, for example, tantalum nitride (TaN), tantalum (Ta), titanium (Ti), titanium nitride (TiN). The conductive material layer may be deposited using typical deposition techniques, for example, physical vapor deposition, atomic layer deposition, molecular layer deposition, and chemical vapor deposition.

The hard mask 224 may formed on the structure 200 and patterned, directly on an upper horizontal surface of the bottom electrode 222.

Figure 5:
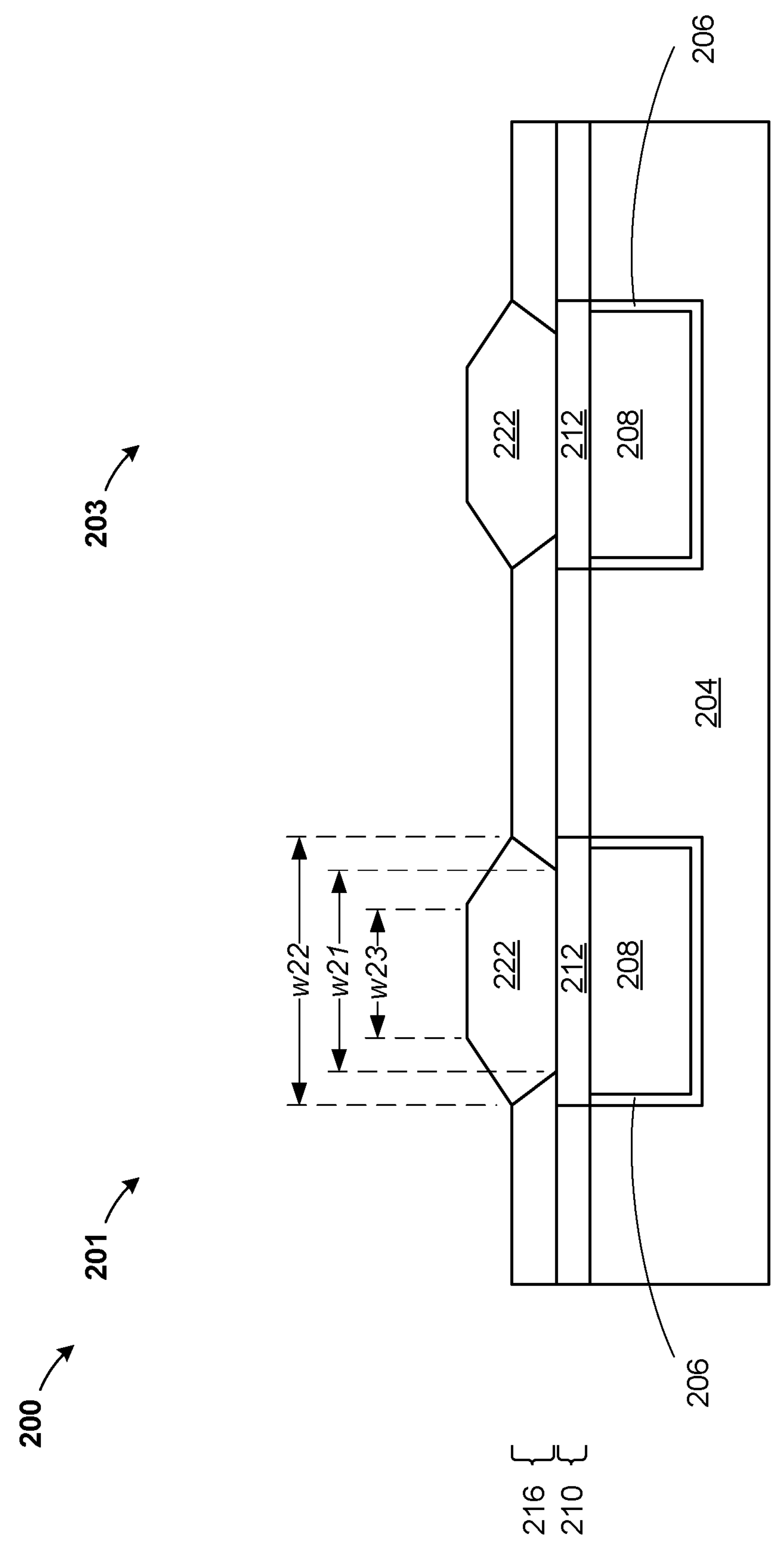
FIG. 5 illustrates a cross-sectional view of the multi-state memory cell and illustrates patterning of a bottom electrode from the bottom electrode layer and removal of the hard mask, according to an exemplary embodiment.

Referring now to FIG. 5, a cross-sectional view of the structure 200 is shown, according to an embodiment. Portions of the bottom electrode 222 may be removed and the hard mask 224 may be removed.

Portions of the bottom electrode 222 may be removed selective to the hard mask 218. The portions of the bottom electrode 222 may be selectively removed using an anisotropic etching technique, such as, for example, reactive ion etching. The remaining portions of the bottom electrode 222 may be vertically aligned above the metal cap 212 and the lower metal wire 208 in each of the cells 201, 203. In an embodiment, the bottom electrode 222 may have a thickness ranging from about 10 nm to about 100 nm, although a thickness less than 10 nm and greater than 100 nm may be acceptable.

The bottom electrode 222 may have a hexagonal shaped side surface. A width of the bottom electrode 222 at a lower horizontal surface closest to the lower metal wire 208 is w21. A width of the bottom electrode 222 at a widest width of the bottom electrode 222, at approximately a mid-point of a height of the bottom electrode, is w22. A width of the bottom electrode 222 at upper horizontal surface is w23. The widest width of the bottom electrode 222, approximately at half of a height of the bottom electrode 222, w22, is greater than w21, and is also greater than w23. In an embodiment w21 is greater than w23. In an alternate embodiment, w23 is greater than w21.

A lower portion of a vertical sidewall of the bottom electrode 222 may have a sidewall angle which may range between 10 and 50 degrees in an embodiment. An upper portion of the vertical sidewalls of the bottom electrode 222 may have a sidewall angle which may range between 130 and 170 degrees in an embodiment. The bottom electrode 222 may be referred to as having a hexagonal shape.

The hard mask 224 may be removed using known techniques.

Figure 6:
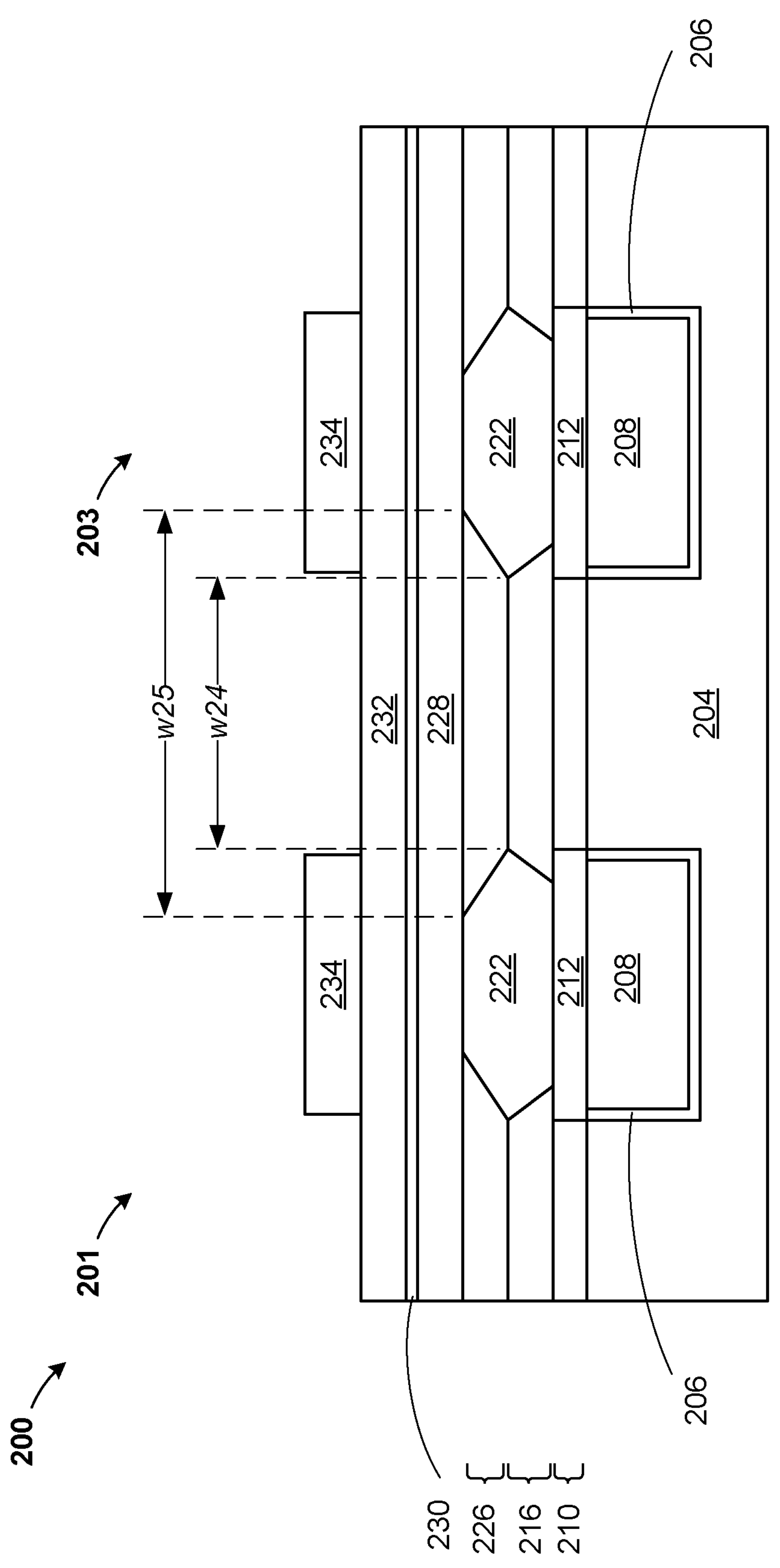
FIG. 6 illustrates a cross-sectional view of the multi-state memory cell and illustrates formation of an inter-layer dielectric, a reference layer, a tunneling barrier, a free layer and a hard mask, according to an exemplary embodiment.

Referring now to FIG. 6, a cross-sectional view of the structure 200 is shown, according to an embodiment. An inter-layer dielectric (hereinafter "ILD") 226, a reference layer 228, a tunneling barrier 230, a free layer 232 and a hard mask 234 may be formed.

The ILD 226 may be formed as described for the ILD 204, directly on upper horizontal surfaces and vertical side surfaces of the bottom electrode 222 and upper horizontal surfaces of the ILD 216.

There is no gap fill concern when forming the ILD 226 due to the low aspect ratio of filling openings between the bottom electrode 222, due to the outward slant of vertical side surfaces of the bottom electrode 222. The ILD 226 is unlikely to contain voids as the ILD 226 is blanket deposited on the structure 200 and fills openings between adjacent bottom electrodes 222, between adjacent cells 201, 203. This is less likely to contain voids than forming an inter-layer dielectric surrounding multiple layers of the cells 201, 203. Additionally, while forming the ILD 226, the ILD 226 first fills a lower width, w24, between cells 201, 203, which is smaller than an upper width, w25 between cells 201, 203, resulting in a lower likelihood of voiding.

A planarization process, such as, for example, chemical mechanical polishing (CMP), may be done to remove excess material from a top surface of the structure 200 such that upper horizontal surfaces of the bottom electrode 222 and the ILD 226 are coplanar.

The reference layer 228 may be formed conformally on the structure 200. The reference layer 228 may cover an upper horizontal surface of the ILD 226 and an upper horizontal surface of the bottom electrode 222.

The tunneling barrier 230 may be formed conformally on the structure 200, on an upper horizontal surface of the reference layer 228.

The free layer 232 may be formed conformally on the structure 200, on an upper horizontal surface of the tunneling barrier 230.

The hard mask 234 may be patterned such that portions of the hard mask 234 remain vertical aligned above the metal cap 212 and the lower metal wire 208, in each of the cells 201, 203.

Figure 7:
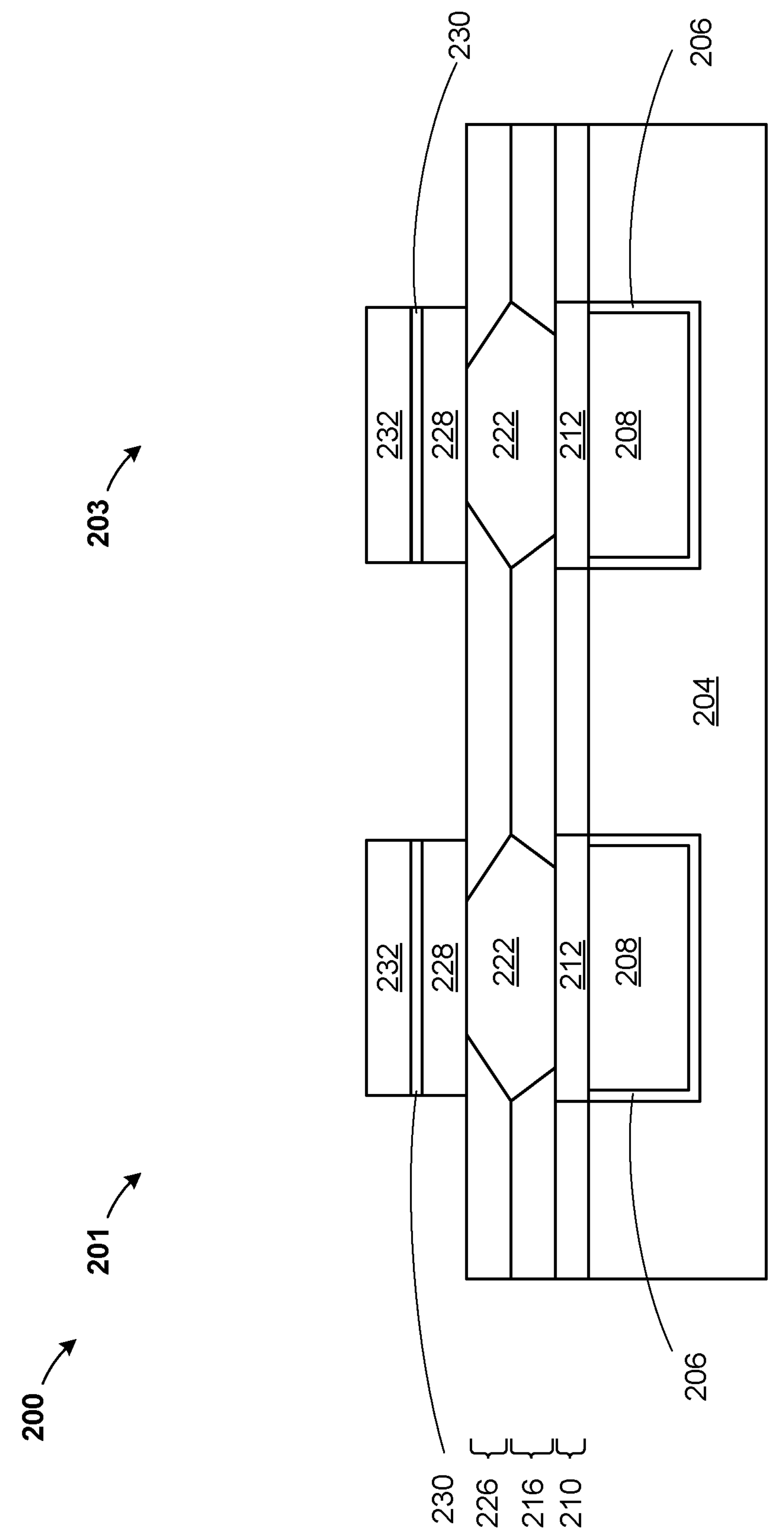
FIG. 7 illustrates a cross-sectional view of the multi-state memory cell and illustrates patterning of the reference layer, the tunneling barrier and the free layer and removal of the hard mask, according to an exemplary embodiment.

Referring now to FIG. 7, a cross-sectional view of the structure 100 is shown, according to an embodiment. Portions of the reference layer 228 may be removed, portions of the tunneling barrier 230 and portions of the free layer 226 may be removed. The hard mask 234 may be removed.

The portions of the reference layer 228, the tunneling barrier 230 and the free layer 232 may be removed selective to the hard mask 234 and the ILD 226. The portions of the reference layer 228, the tunneling barrier 230 and the free layer 232 may be selectively removed using an anisotropic etching technique, such as, for example, reactive ion etching. The remaining portions of the reference layer 228, the tunneling barrier 230 and the free layer 232 may remain vertically aligned above the bottom electrode 222, the metal cap 212 and the lower metal wire 208, in each of the cells 201, 203.

There is no risk of re-sputtering of the bottom electrode 222 during the MTJ stack patterning as the bottom electrode 222 is not exposed while removing the portions of the reference layer 228, the tunneling barrier 230 and the free layer 232.

The hard mask 234 may be removed using known techniques.

Figure 8:
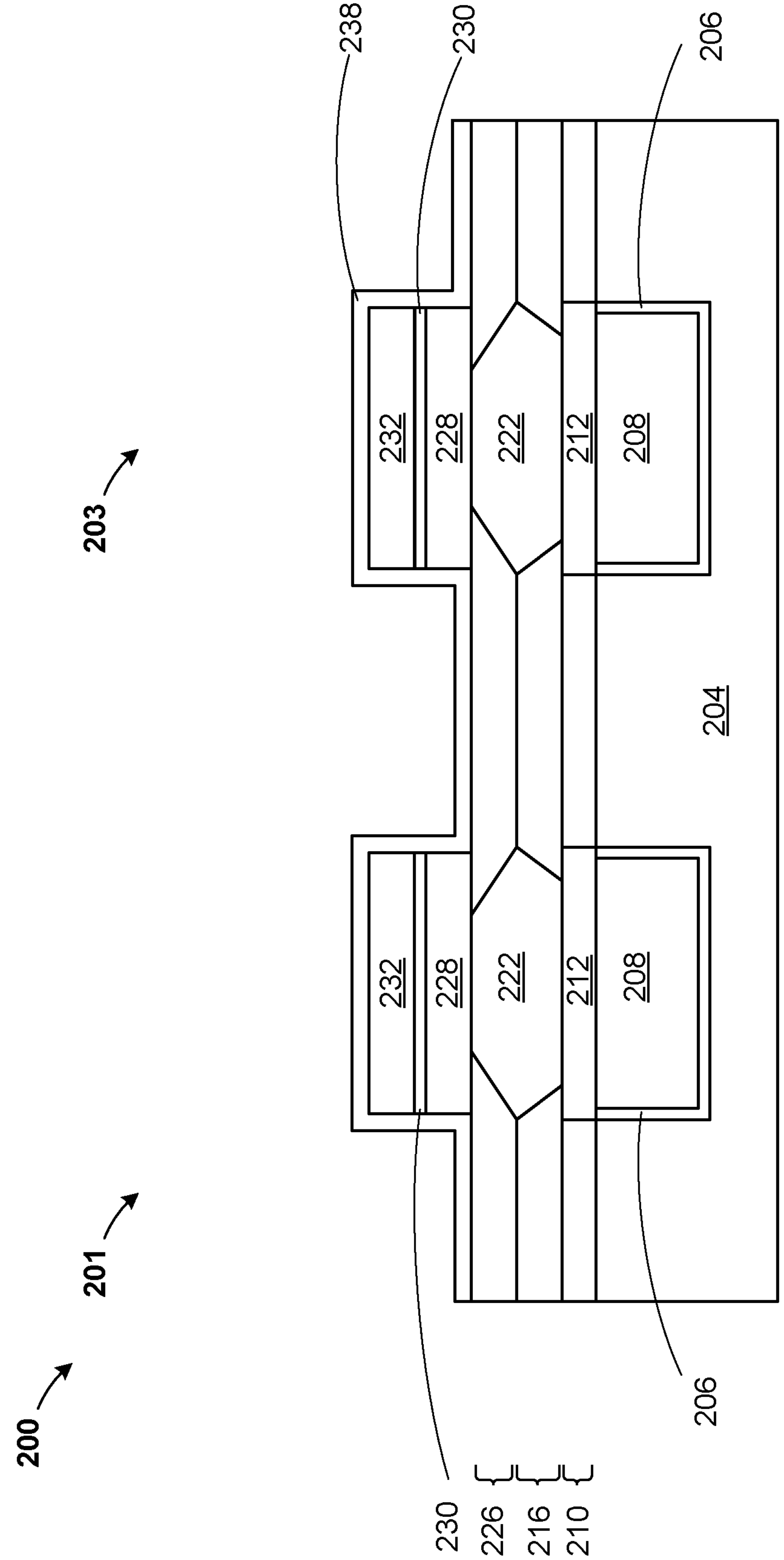
FIG. 8 illustrates a cross-sectional view of the multi-state memory cell and illustrates formation of an encapsulation layer, according to an exemplary embodiment.

Referring now to FIG. 8, a cross-sectional view of the structure 200 is shown, according to an embodiment. An encapsulation layer 238 may be formed.

The encapsulation layer 238 may be conformally formed on the structure 200, on an upper horizontal surface of the ILD 226, on an upper horizontal surface and vertical side surfaces of the free layer 232 and on vertical side surfaces of the tunneling barrier 230 and the reference layer 228. The encapsulation layer 238 may include materials such as, for example, any dielectric material such as silicon nitride (SiN) and silicon nitride carbon (SiNC) and may include a single layer or may include multiple layers of dielectric material. In an alternate embodiment, the encapsulation layer 238 may include silicon aluminum nitride (SiAlN). The encapsulation layer 238 may be deposited using typical deposition techniques, for example, physical vapor deposition, atomic layer deposition, molecular layer deposition, and chemical vapor deposition. The encapsulation layer 238 may have a thickness between 3 nm and 30 nm, although thickness greater than 30 nm or less than 3 nm are acceptable.

The encapsulation layer 238 helps to protect the reference layer 228, the tunneling barrier 230 and the free layer 232, from being damaged or oxidized during subsequent ILD materials deposition.

Figure 9:
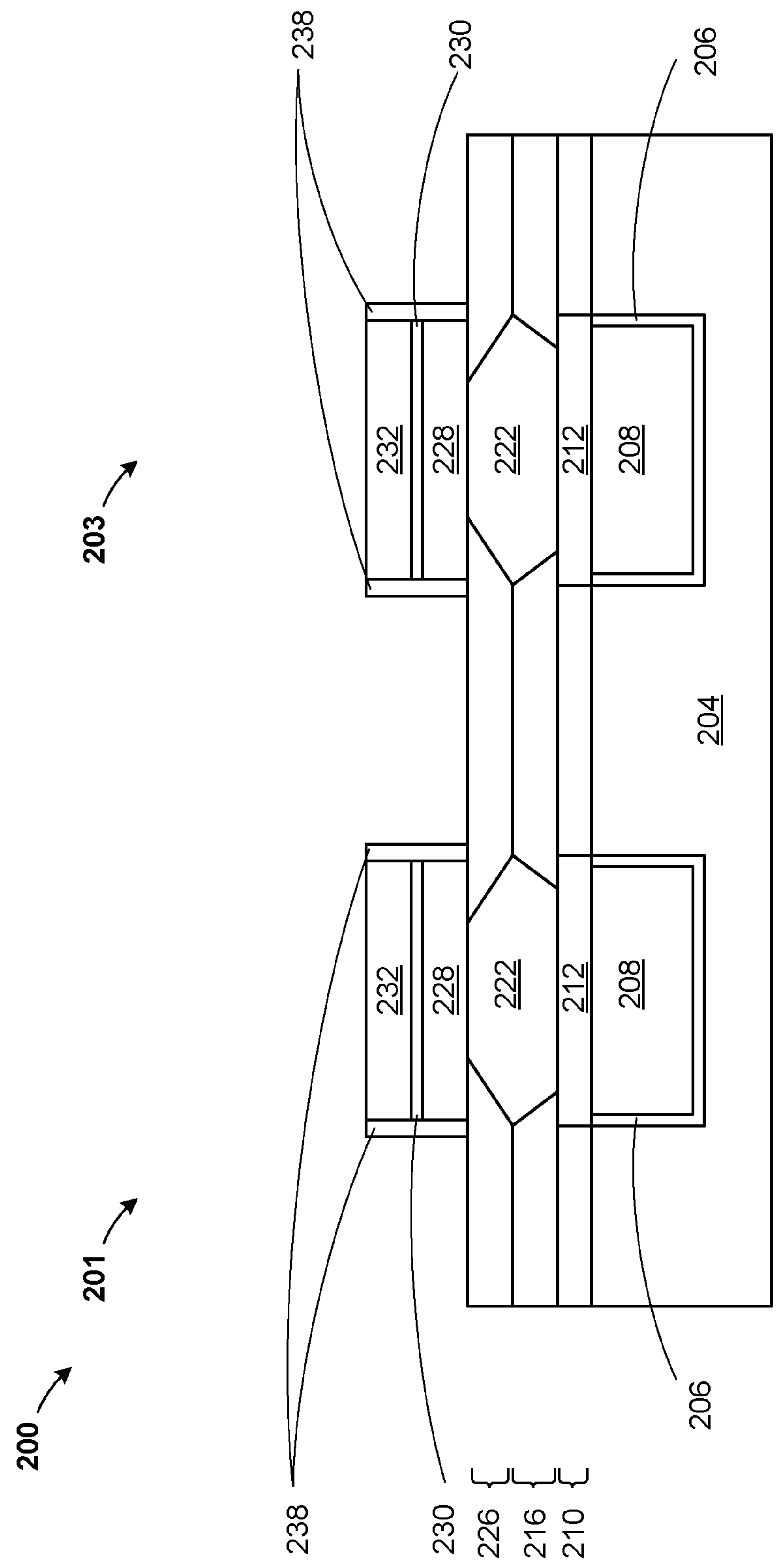
FIG. 9 illustrates a cross-sectional view of the multi-state memory cell and illustrates removal of portions of the encapsulation layer, according to an exemplary embodiment.

Referring now to FIG. 9, a cross-sectional view of the structure 200 is shown, according to an embodiment. Portions of the encapsulation layer 238 may be removed.

The portions of the encapsulation layer 238 may be selectively removed using an isotropic etching technique, such as, for example, reactive ion etching. The remaining portions of the encapsulation layer 238 may remain vertically aligned directly adjacent to the reference layer 228, the tunneling barrier 230 and the free layer 232, in both the cells 201, 203. The encapsulation layer 238 may be removed from upper horizontal surfaces of the free layer 232 and the ILD 226.

Figure 10:
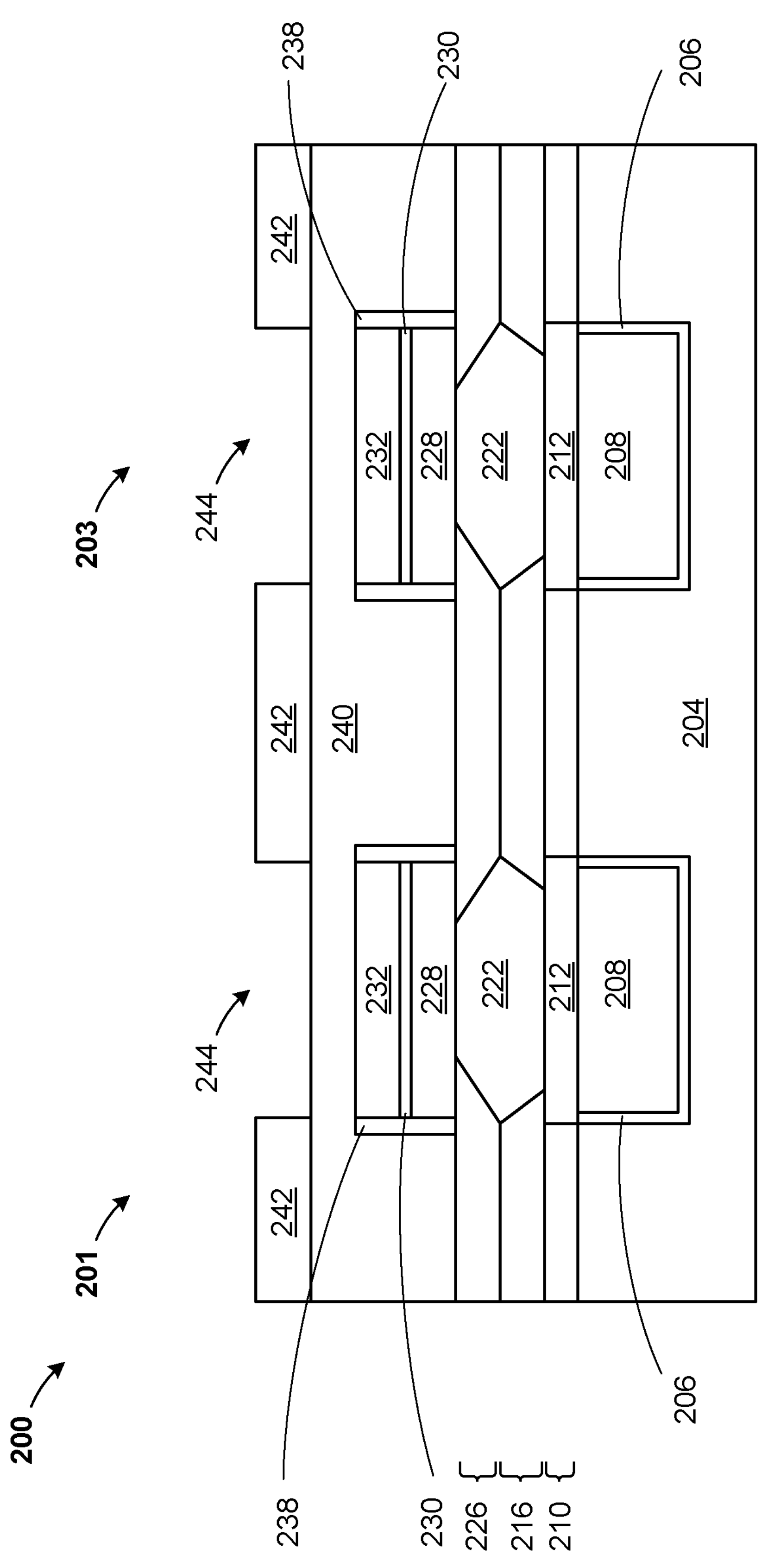
FIG. 10 illustrates a cross-sectional view of the multi-state memory cell and illustrates formation of an inter-layer dielectric and a hard mask, according to an exemplary embodiment.

Referring now to FIG. 10, a cross-sectional view of the structure 200 is shown, according to an embodiment. An inter-layer dielectric (hereinafter "ILD") 240 may be formed. A hard mask 242 may be formed.

The ILD 240 may be formed as described for the ILD 204, directly on an upper horizontal surface of the free layer 232 and the ILD 226, and vertical side surfaces of the encapsulation layer 238. Due to the low aspect ratio of height to width of filling spaces between adjacent cells 201, 203, there is no ILD 240 gap fill concern.

The hard mask 242 may be patterned such that an opening 244 in the hard mask 242 is vertical aligned above the bottom electrode 222, the metal cap 212 and the lower metal wire 208, in each of the cells 101, 103.

Figure 11:
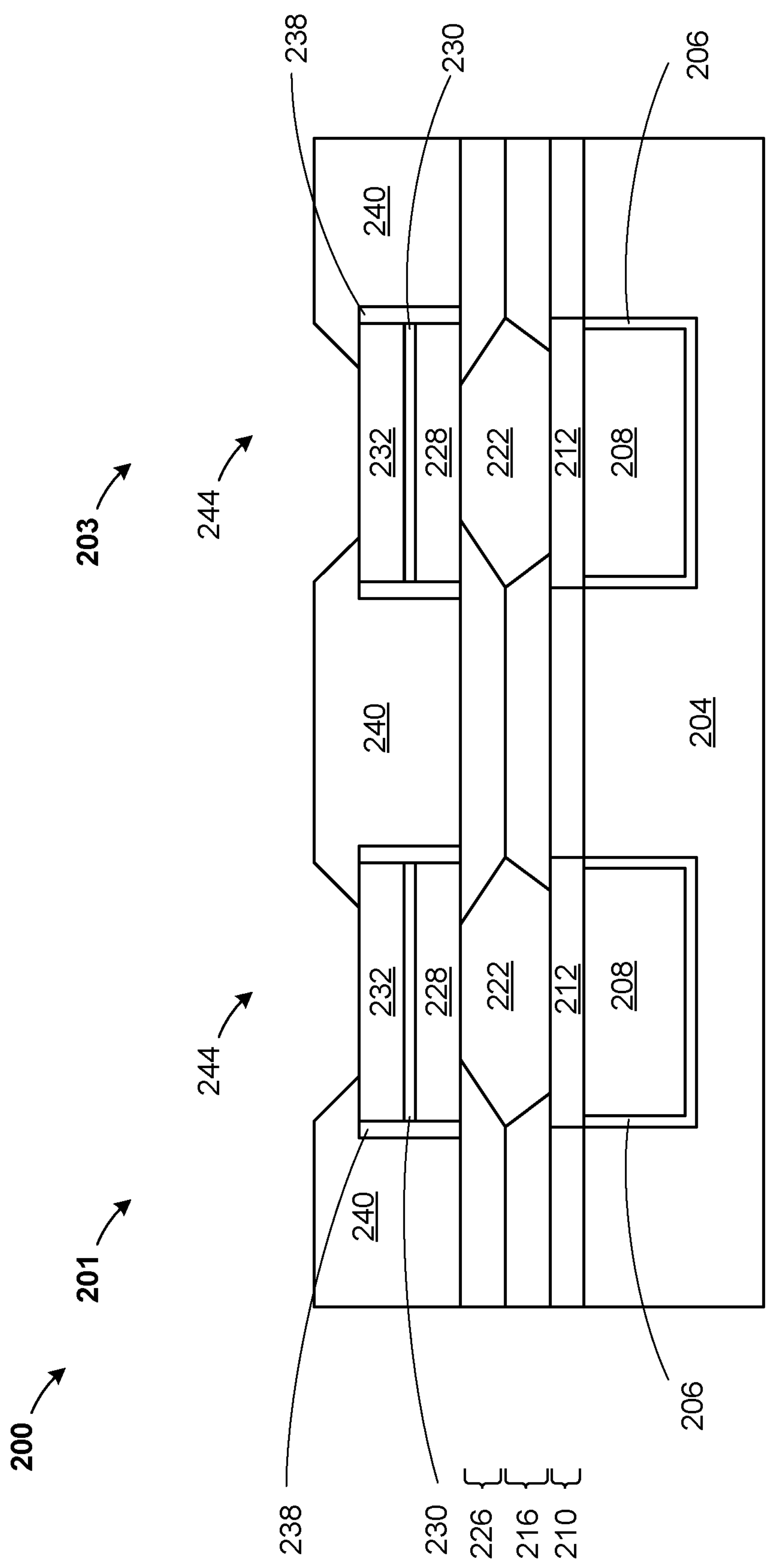
FIG. 11 illustrates a cross-sectional view of the multi-state memory cell and illustrates patterning of the inter-layer dielectric and removal of the hard mask, according to an exemplary embodiment.

Referring now to FIG. 11, a cross-sectional view of the structure 200 is shown, according to an embodiment. Portions of the ILD 240 may be removed. The hard mask 242 may be removed.

Portions of the ILD 240 may be removed selective to the hard mask 242, exposing an upper horizontal surface of the free layer 232 and forming an opening 244. The portions of the ILD 240 may be selectively removed using an anisotropic etching technique, such as, for example, reactive ion etching. The remaining portions of the ILD 240 may remain between the cells 101, 103. The opening 244 may have a vertical side surface which is angled, such that a width of the opening 244 is widest at the top.

Figure 12:
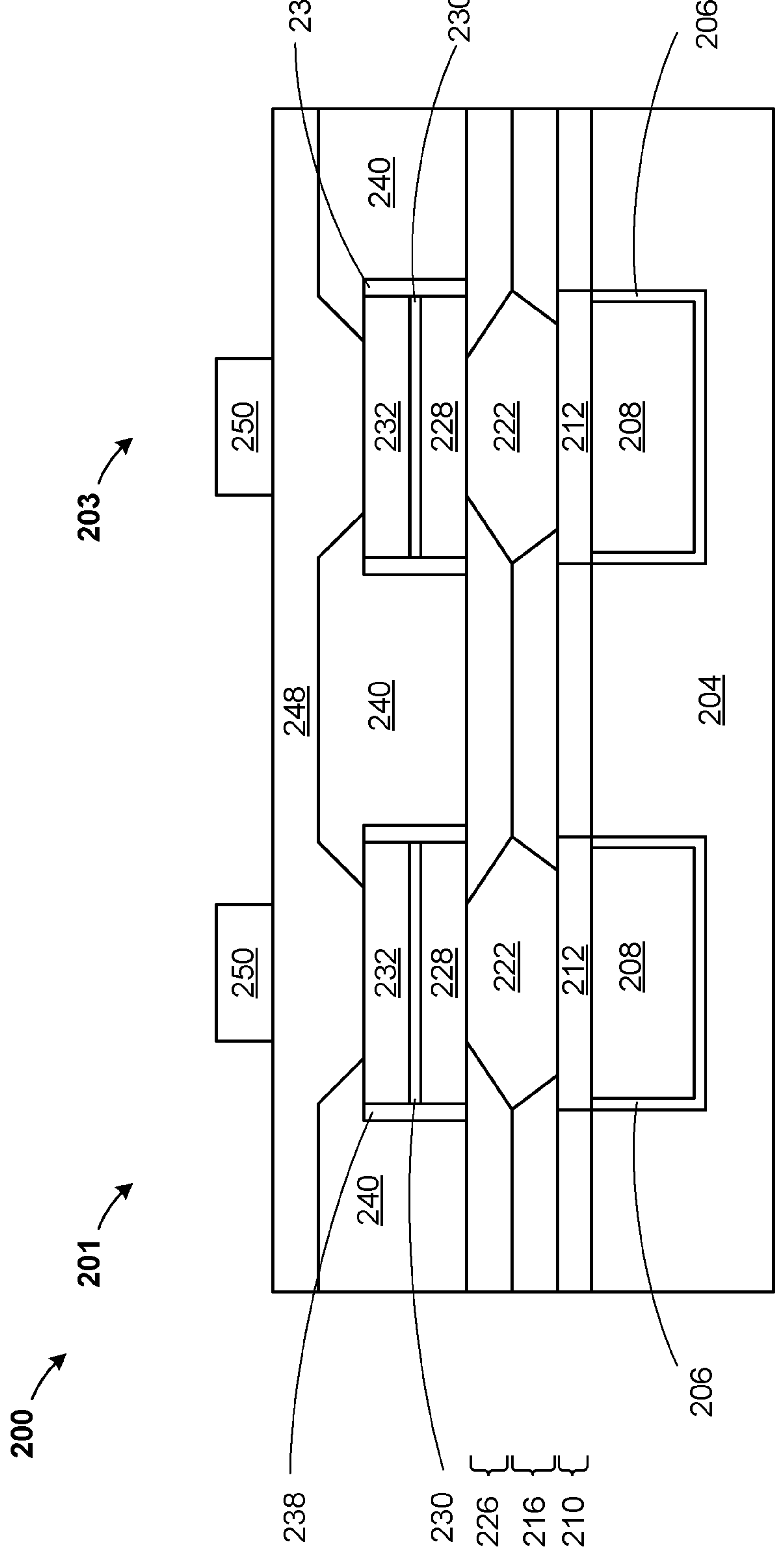
FIG. 12 illustrates a cross-sectional view of the multi-state memory cell and illustrates formation of a top electrode layer and a hard mask.

Referring now to FIG. 12, a cross-sectional view of the structure 200 is shown, according to an embodiment. A top electrode 248 may be formed. A hard mask 250 may be formed.

In an embodiment, the top electrode 248 is formed from a conductive material layer which is blanket deposited on top of the structure 200, and directly on a top surface of the free layer 232 and the ILD 240. The conductive material layer may include materials such as, for example, tantalum nitride (TaN), tantalum (Ta), titanium (Ti), titanium nitride (TiN). The conductive material layer may be deposited using typical deposition techniques, for example, physical vapor deposition, atomic layer deposition, molecular layer deposition, and chemical vapor deposition.

The hard mask 250 may formed on the structure 200 and patterned, directly on an upper horizontal surface of the top electrode 248.

Figure 13:
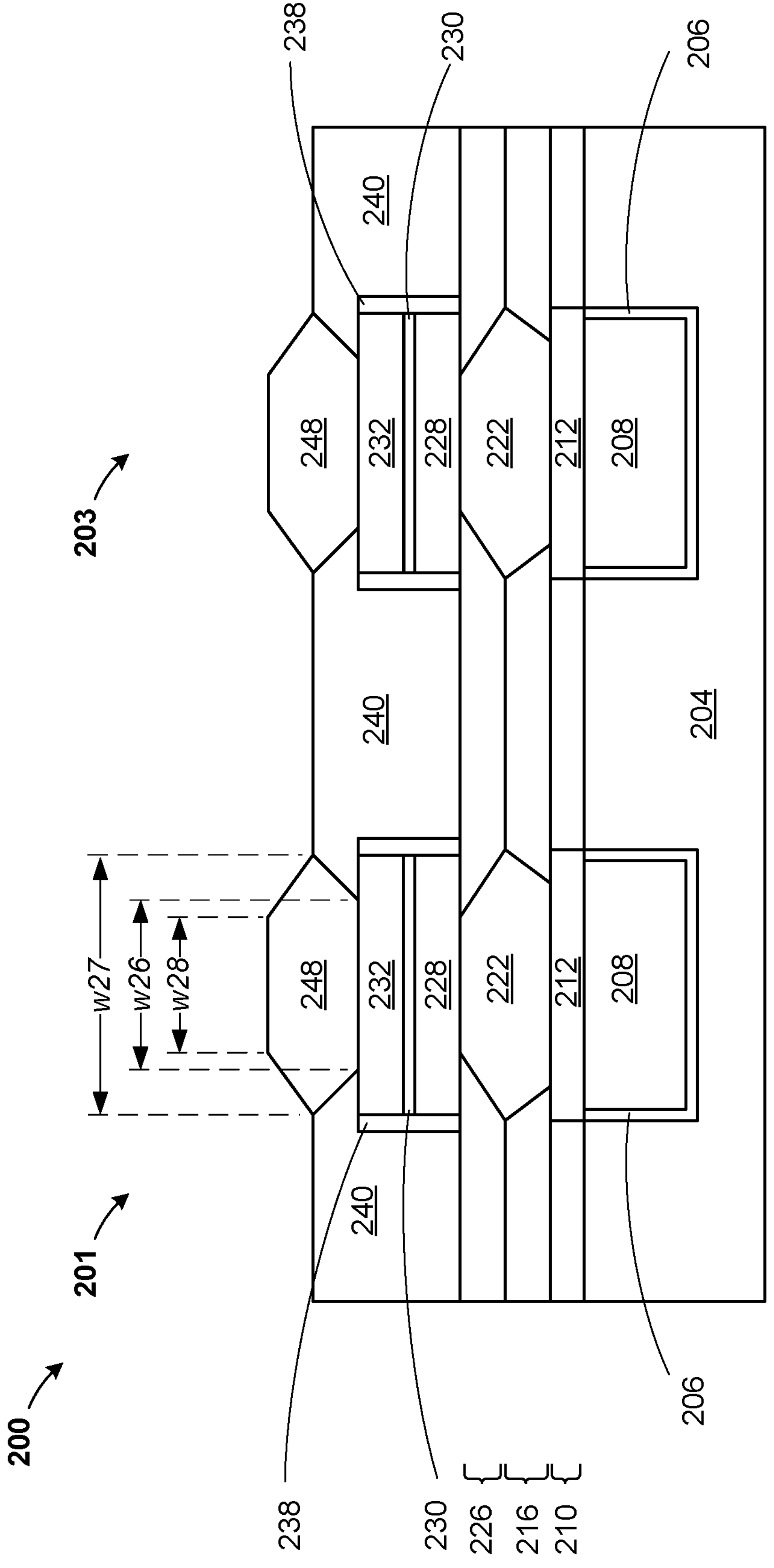
FIG. 13 illustrates a cross-sectional view of the multi-state memory cell and illustrates patterning a top electrode from the top electrode layer and removal of the hard mask according to an exemplary embodiment.

Referring now to FIG. 13, a cross-sectional view of the structure 200 is shown, according to an embodiment. Portions of the top electrode 248 may be removed and the hard mask 250 may be removed.

Portions of the top electrode 248 may be removed selective to the hard mask 250. The portions of the top electrode 248 may be selectively removed using an anisotropic etching technique, such as, for example, reactive ion etching. The remaining portions of the top electrode 248 may be vertically aligned above the bottom electrode 222, the metal cap 212 and the lower metal wire 208 in each of the cells 201, 203. In an embodiment, the top electrode 248 may have a thickness ranging from about 10 nm to about 100 nm, although a thickness less than 10 nm and greater than 100 nm may be acceptable.

The top electrode 248 may have a hexagonal shaped side surface. A width of the top electrode 248 at a lower horizontal surface closest to the lower metal wire 208 is w26. A width of the top electrode 248 at a widest width of the top electrode 248, at approximately a mid-point of a height of the top electrode 248, is w27. A width of the top electrode 248 at upper horizontal surface 208 is w28. The widest width of the top electrode 248, w27, is greater than w26, and is also greater than w28. In an embodiment w26 is greater than w28. In an alternate embodiment, w28 is greater than w26.

A lower portion of a vertical sidewalls of the top electrode 248 may have a sidewall angle which may range between 10 and 50 degrees in an embodiment. An upper portion of the vertical sidewalls of the top electrode 248 may have a sidewall angle which may range between 130 and 170 degrees in an embodiment. The top electrode 248 may be referred to as having a hexagonal shape.

The hard mask 224 may be removed using known techniques.

Figure 14:
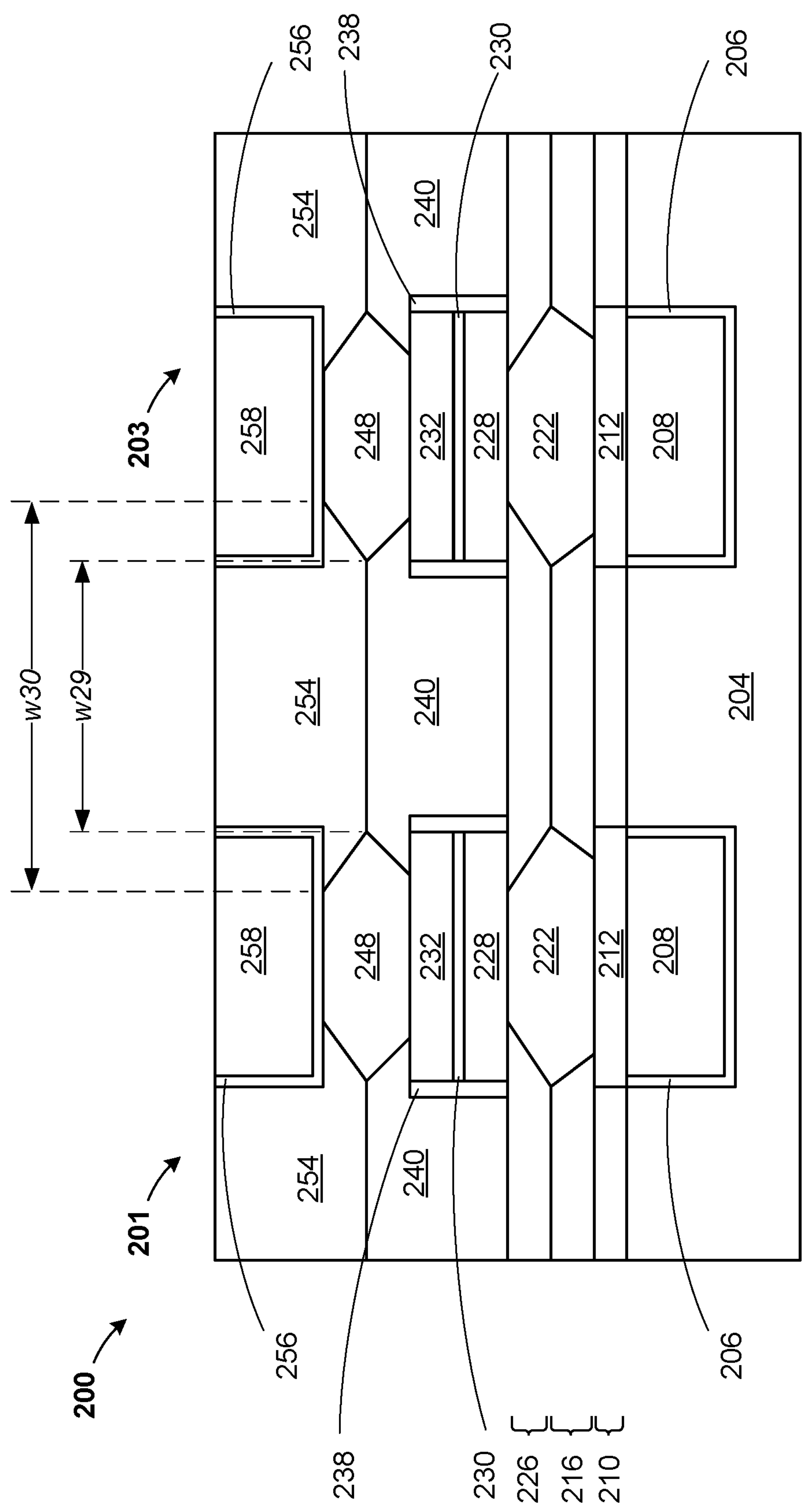
FIG. 14 illustrates a cross-sectional view of the multi-state memory cell and illustrates formation of an inter-layer dielectric and an upper metal wire, according to an exemplary embodiment.

Referring now to FIG. 14, a cross-sectional view of the structure 200 is shown, according to an embodiment. An inter-layer dielectric (hereinafter "ILD") 254, may be formed. A liner 256 may be formed. An upper metal wire 258 may be formed.

The ILD 254 may be formed as described for the ILD 204, conformally on the structure 200, covering upper horizontal surfaces of the top electrode 248 and the ILD 240, and vertical side surfaces of the top electrode 248.

The ILD 254 is unlikely to contain voids as the ILD 254 is blanket deposited on the structure 200 and fills openings between adjacent top electrodes 248, between adjacent cells 201, 203. This is less likely to contain voids than forming an inter-layer dielectric surrounding multiple layers of the cell 201, 203. Additionally, while forming the ILD 254, the ILD 254 first fills a lower width, w29, between cells 201, 203, which is smaller than an upper width, w30, between cells 201, 203, resulting in a lower likelihood of voiding.

The upper metal wire 258 may be formed by first patterning a trench (not shown) into the ILD 254, lining the trench with the liner 256, and filling the trench.

The liner 256 separates the conductive interconnect material of the upper metal wire 258 from the ILD 254. The liner 256 may be formed as described for the liner 206. The liner 256 surrounds a lower horizontal surface and a vertical side surface of the upper metal wire 258.

The upper metal wire 258 may be formed as described for the lower metal wire 208. There may be any number of openings in the ILD 254, each lined with the liner 256 and the upper metal wire 258, on the structure 200.

A planarization process, such as, for example, chemical mechanical polishing (CMP), may be done to remove excess material from a top surface of the structure 200 such that upper horizontal surfaces of the upper metal wire 258, the liner 256 and the ILD 254 are coplanar.

The structure 200 has vertically aligned portions of the MTJ stack, including the bottom electrode 222, the reference layer 228, the tunneling barrier 230, the free layer 232 and the top electrode 248. The MTJ stack is vertically aligned between the lower metal wire 208 and the upper metal wire 258. The vertical side surfaces of the bottom electrode 222 and the top electrode 248 have each been individually formed with a tapered side surfaces, resulting in an hexagonal shape. The reference layer 228, the tunneling barrier 230, and the free layer 232 are surrounded by the encapsulation layer 238.

Additionally, the structure 200 has inter-layer dielectric layers formed separately, with the ILD 216 and the ILD 226 surrounding the bottom electrode 222, the ILD 240 surrounding the reference layer 228, the tunneling barrier 230, the free layer 232 and a portion of the top electrode 248, and the ILD 254 surrounding a remaining portion of the top electrode 248. Each of the ILDs 216, 226, 240, 254 are formed individually and have less voiding of an inter-layer dielectric formed at one time for a same total volume of ILD for the entire MTJ stack, for each cell 201, 203.

An MRAM pillar with hexagonal shaped electrodes helps to prevent shorts due to metal re-sputtering and helps to reduce ILD voiding between adjacent MTJ stacks. This helps to extend scalability of MRAM device memory elements due to void-free gap fill between MRAM pillars and improved embedded MRAM performance due to reduced top contact shorts.

In an embodiment the MRAM pillar may have a hexagonal shaped bottom electrode and a trapezoid shaped top electrode. In an embodiment, the MRAM pillar may have a trapezoid shaped bottom electrode and a hexagonal shaped top electrode. In an embodiment, the MRAM pillar may have a standard shaped vertically aligned bottom electrode and a hexagonal shaped top electrode. In an embodiment, the MRAM pillar may have a hexagonal shaped bottom electrode and a standard shaped vertically aligned top electrode.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:

a magnetic tunnel junction (MTJ) stack, wherein a cross section of a bottom electrode of the stack comprises a hexagonal profile and a cross section of a top electrode of the stack comprises a hexagonal profile, wherein a width of the MTJ stack is greater than the width of a connecting surface of the bottom electrode, wherein the connecting surface of the bottom electrode is the surface that connects the bottom electrode to the MTJ stack, and wherein the width of the MTJ stack is greater than the width of a connecting surface of the top electrode, wherein the connecting surface of the top electrode is the surface that connects the top electrode to the MTJ stack.

2. The semiconductor device according to claim 1, further comprising:

the MTJ stack comprises vertically aligned layers of a top electrode, a free layer, a tunneling barrier, a reference layer and the bottom electrode.

3. The semiconductor device according to claim 1, further comprising:

the bottom electrode comprises a side surface comprising a width at a middle section of the bottom electrode greater than a width at a lower surface of the bottom electrode, and the width at the middle section of the bottom electrode greater than a width at an upper surface of the bottom electrode.

4. The semiconductor device according to claim 1, further comprising:

the top electrode comprises a side surface comprising a width at a middle section of the top electrode greater than a width at a lower surface of the top electrode, and the width at the middle section of the top electrode greater than a width at an upper surface of the top electrode.

5. The semiconductor device according to claim 1, further comprising:

an encapsulation layer surrounding vertical side surfaces of a free layer, a tunneling barrier and a reference layer.

6. A semiconductor device comprising:

a lower word line;

a magnetic tunnel junction (MTJ) stack, wherein a cross section of a first electrode of the MTJ stack comprises a hexagonal profile and a cross section of a second electrode of the stack comprises a hexagonal profile, wherein a width of the MTJ stack is greater than the width of a connecting surface of the first electrode, wherein the connecting surface of the first electrode is the surface that connects the first electrode to the MTJ stack, and wherein the width of the MTJ stack is greater than the width of a connecting surface of the second electrode, wherein the connecting surface of the second electrode is the surface that connects the second electrode to the MTJ stack.

7. The semiconductor device according to claim 6, wherein the magnetic tunnel junction (MTJ) stack is located above and connected to the first electrode.

8. The semiconductor device according to claim 7, further comprising:

the MTJ stack comprises vertically aligned layers of second electrode, a free layer, a tunneling barrier, a reference layer and the first electrode.

9. The semiconductor device according to claim 8, further comprising:

an encapsulation layer surrounding vertical side surfaces of the free layer, the tunneling barrier and the reference layer.

10. The semiconductor device according to claim 6, further comprising:

the first electrode comprises a side surface comprising a width at a middle section of the first electrode greater than a width at a lower surface of the first electrode, and the width at the middle section of the first electrode greater than a width at an upper surface of the first electrode.

11. The semiconductor device according to claim 6, further comprising:

the second electrode comprises a side surface comprising a width at a middle section of the second electrode greater than a width at a lower surface of the second electrode, and the width at the middle section of the second electrode greater than a width at an upper surface of the second electrode.

* * * * *